United States Patent [19]

Frye et al.

[11] 4,118,795
[45] Oct. 3, 1978

[54] TWO-PHASE CCD REGENERATOR - I/O CIRCUITS

[75] Inventors: Robert Charles Frye, Brighton, Mass.; Alan Harry Katz, New Orleans, La.; Charles Robert Hewes, Dallas, Tex.

[73] Assignee: Texas Instruments Incorporated, Dallas, Tex.

[21] Appl. No.: 718,243

[22] Filed: Aug. 27, 1976

[51] Int. Cl.$^2$ .................. G11C 21/00; G11C 7/00; G11C 11/34

[52] U.S. Cl. ........................ 365/222; 307/221 C; 365/77; 365/183

[58] Field of Search ..... 340/173 R, 173 RC, 173 DR; 357/24; 307/221 C; 365/77, 183, 222

[56] References Cited

U.S. PATENT DOCUMENTS

| | | | |
|---|---|---|---|
| 3,944,990 | 3/1976 | Chou | 340/173 RC |
| 3,979,603 | 9/1976 | Gosney | 357/24 |
| 3,999,171 | 12/1976 | Parsons | 340/173 RC |

OTHER PUBLICATIONS

Engeler et al., A Surface-Charge Random-Access Memory System, IEEE Journal of Solid-State Circuits, vol. SC-7, No. 5, 10/72, pp. 330-335.
Krambeck et al., Implanted-Barrier Two-Phase Charge-Coupled Device, Applied Physics Letters, vol. 19, No. 12, 12/15/71, pp. 520-522.
Lees et al., A Simple Model of a Buried Channel Charge Coupled Device, Solid-State Electronics, vol. 17, pp. 1163-1169.

*Primary Examiner*—Stuart N. Hecker
*Attorney, Agent, or Firm*—James T. Comfort; Rene' E. Grossman; William E. Hiller

[57] ABSTRACT

Insulated gate field effect transistor charge regenerator amplifiers respectively cross-couple the output regions of a pair of two-phase CCD structures with the input regions of those structures. Each amplifier senses the level of binary data charge packets from the output region of one of the shift register structures and in response thereto applies a regenerated and inverted binary data charge packet to the input region of the other shift register structure. One of the amplifiers includes logic gating for inputting and outputting data into and from the shift register structure.

A charge regenerator for a two-phase CCD structure comprising first and second shift registers. The charge regenerator comprises a source follower amplifier including a driver transistor, a load transistor and a positive feedback transistor connected between the gate and source of the driver transistor. The gate of the driver transistor is precharged to a predetermined level prior to sensing of the output region charge level and the regenerator inserts into the input region a charge packet corresponding to the data level sensed at the output region, without inversion.

15 Claims, 10 Drawing Figures

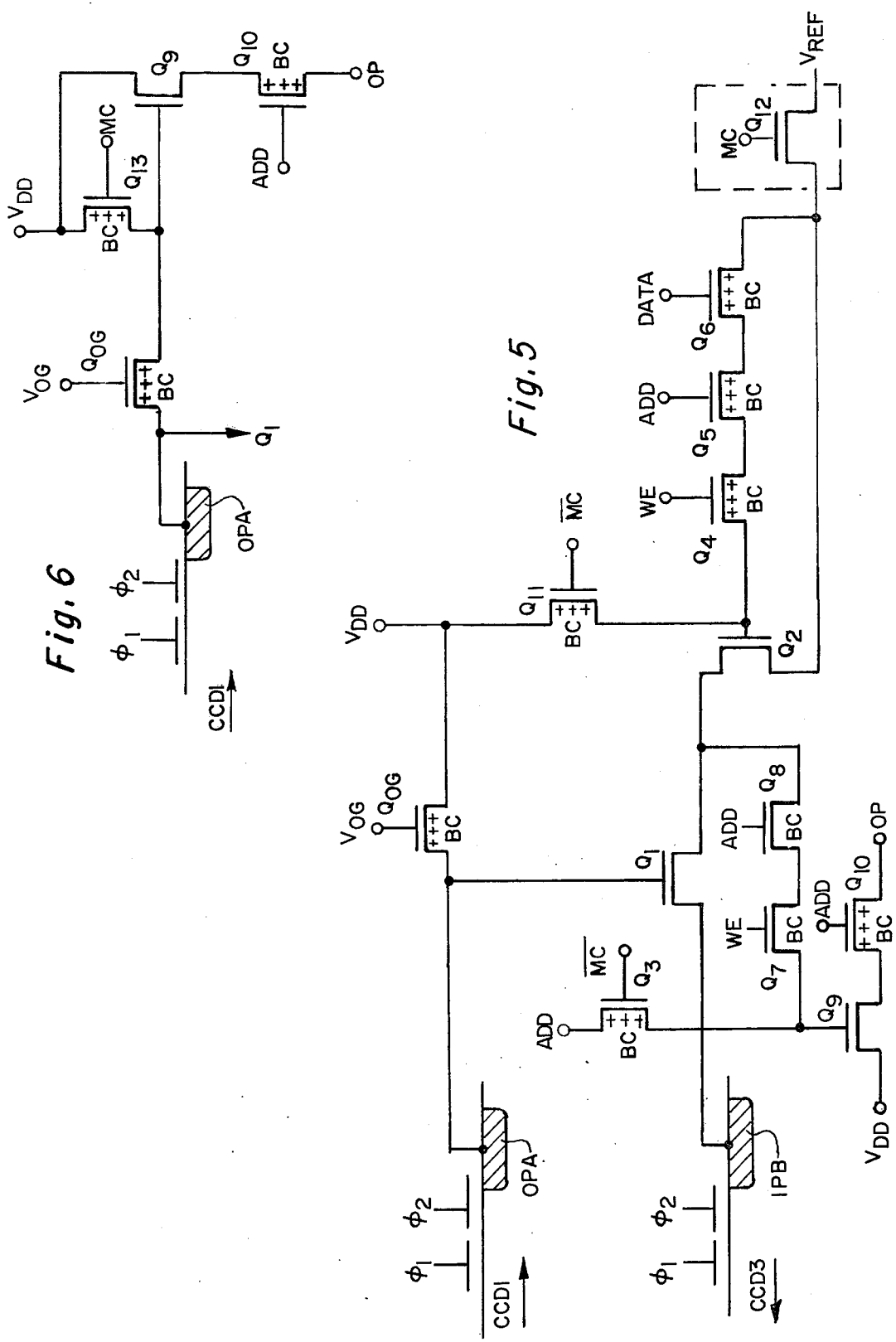

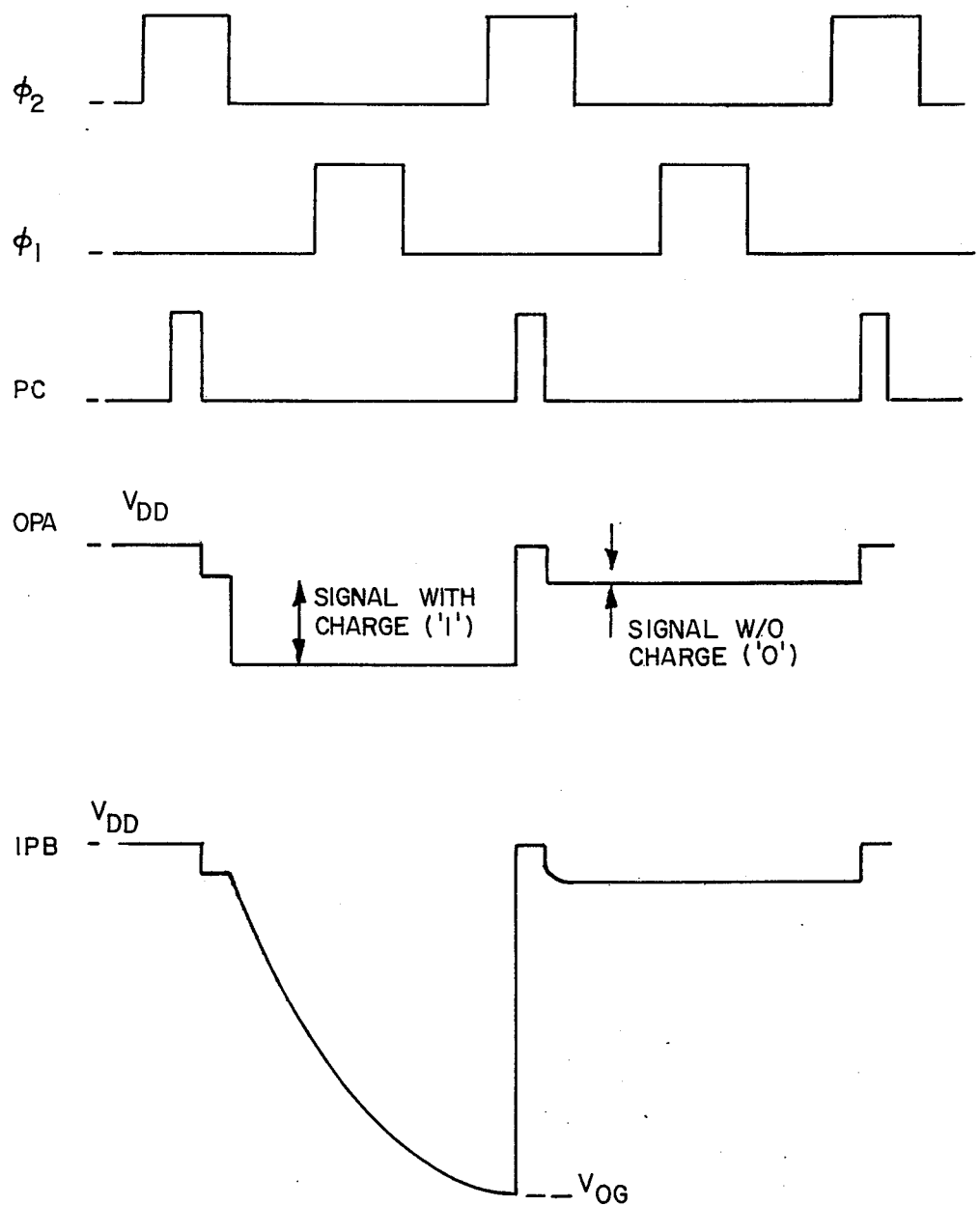

TWO-PHASE CCD REGENERATOR - I/O CIRCUITS

The present invention relates to charge regenerator circuits for charge coupled device (CCD) structures and to CCD memories incorporating such regenerators.

In U.S. Pat. No. 3,944,990 there is disclosed a charge regenerator which receives charge representing a binary data level from the output of a first CCD shift register and inputs charge representing the opposite binary data level into a second CCD shift register. The shift registers are n-channel structures and the output of the first shift register, which is connected to the gate of an insulated gate field effect transistor, is precharged to a positive potential while the input of the second shift register is grounded. A binary one charge packet shifted into the output region cuts off the transistor and a binary zero charge packet is entered into the second shift register. A binary zero charge packet shifted into the output region maintains the transistor in a conductive state and a binary one charge packet is entered into the second shift register.

In a first aspect of the present invention there is provided a charge coupled device memory including a pair of charge coupled device shift register structures each having a data input region and a data output region and phased clock pulse means coupled to the shift register structures for shifting binary data charge packets in the shift register structures. First and second insulated field effect transistor charge regenerator amplifiers respectively cross-couple the output regions with the input regions, each amplifier sensing the level of binary data charge packets at the output region of a shift register structure and in response thereto applying a regenerated binary data charge packet to the input region of the other shift register structure. One of the regenerator amplifiers further includes a data input insulated gate field effect transistor circuit operable in response to DATA and ADDRESS inputs for providing a conductive path bypassing the regenerator amplifier to connect the input region associated with that regenerator amplifier alternatively to one of two reference potentials for entering a predetermined binary data charge level into that input region according to the DATA input. A data output insulated gate field effect transistor circuit is operably responsive to an ADDRESS input to nondestructively sense the binary data charge level present at the input or the output region associated with that charge regenerator amplifier, to generate a corresponding binary data output signal.

In another aspect of the present invention, a charge regenerator circuit for a charge coupled device structure including a data output region and a data input region, comprises amplifier means for sensing a charge level at the output region representing a digital one level or a digital zero data level and controllable by the sensed charge level for inserting into the input region a predetermined amount of charge respectively corresponding to the digital one data level or to the digital zero data level without inversion. In a particular embodiment, the amplifier means comprises a source follower insulated gate field effect transistor amplifier incorporating a positive feed-back path.

By way of example, embodiments of the invention will now be described in greater detail, in order further to exemplify and illustrate the invention and advantageous features thereof, with reference to the drawings in which:

FIG. 5 shows a charge regenerator incorporating a modified data input circuit;

FIG. 6 shows a modified data output circuit suitable for use in place of that shown in FIGS. 2a and 5;

FIG. 8 shows waveforms illustrating operation of the structure shown in FIG. 7.

Figure 1:
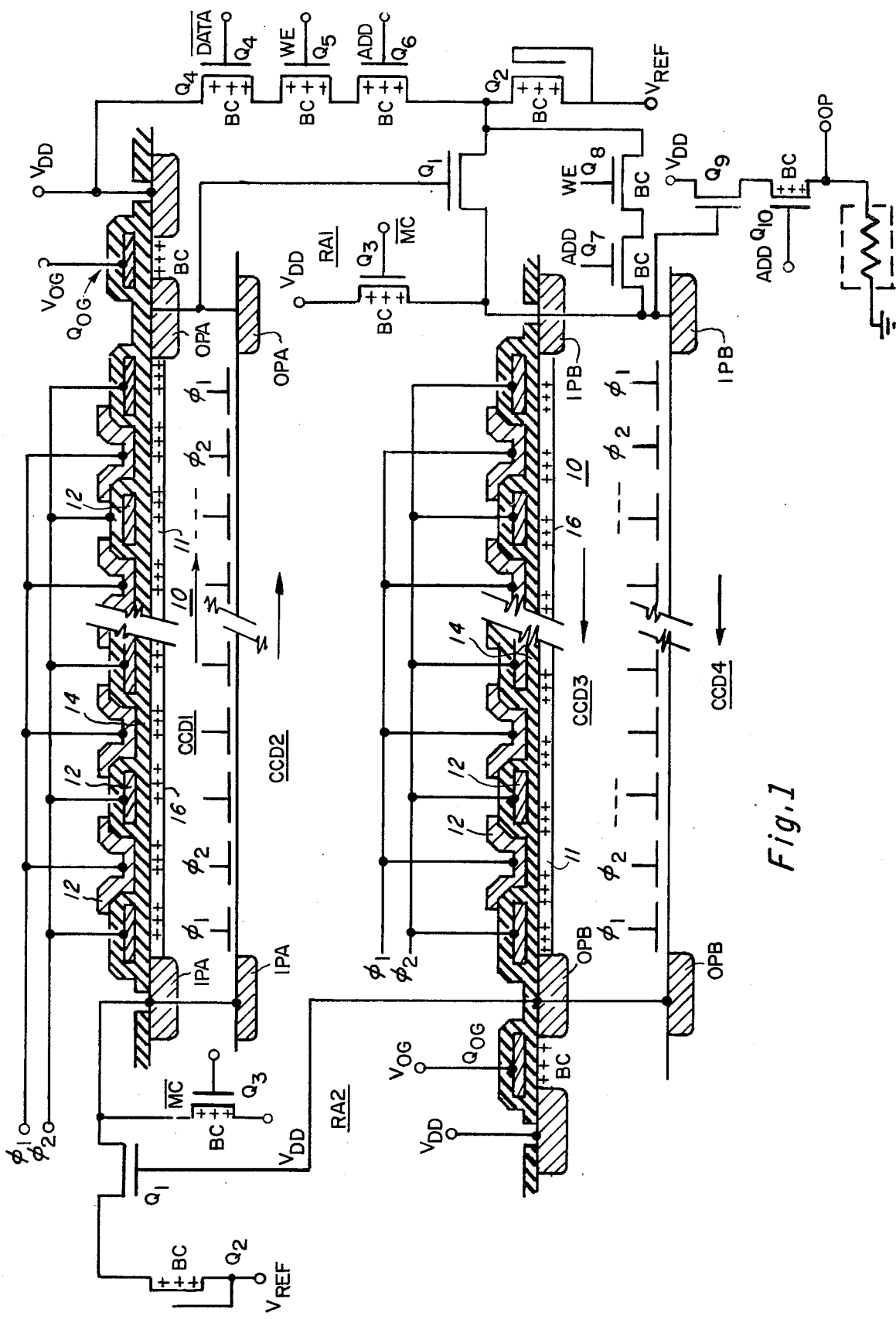
FIG. 1 illustrates a two-phase multiplexed electrode per bit recirculating CCD memory structure incorporating charge regenerators.

FIG. 1 illustrates a CCD memory including four buried channel CCD shift register structures CCD1–CCD4 provided by a common p-type silicon substrate 10. The buried channel of each shift register is defined by a surface n-type layer 11. The shift register structures CCD1 and CCD2 share a common n+ input region IPA and a common n+ output region OPA. Likewise, the shift register structures CCD3 and CCD4 share common input and output regions IPB and OPB respectively. Charge packets representing binary data information, i.e. a logical one or a logical zero, can be inserted into the input regions IPA, IPB and shifted along the corresponding CCD charge propagation channel to the output region OPA or OPB, in the directions indicated by the arrows, by two-phase clock pulses $\phi 1$, $\phi 2$ applied by a clock pulse source CPS to coplanar phase electrodes 12. Charge packets are inputted into and outputted from the channels of shift registers CCD1 and CCD3 by $\phi 2$ clock pulses and into and from the channels of shift registers CCD2 and CCD4 by $\phi 1$ clock pulses. This structure is a two-phase, multiplexed per bit recirculative CCD memory structure.

The phase electrodes 12 transversely span the respective CCD channels and are insulated therefrom and from each other by insulating materials 14, such as silicon oxide. The CCD channels are defined in the substrate 10 by heavily doped p-type regions and overlying thick silicon oxide regions around the periphery of each channel. The portion of the silicon oxide material 14 overlying the channels A and B is relatively thin, 1000 A being suitable. Such CCD structures CCDA and CCDB, together with processes suitable for fabricating them, are described in greater detail in copending application Ser. No. 598,316, filed July 23, 1975, now abandoned in favor of pending continuation application Ser. No. 737,648 filed Nov. 1, 1976, now U.S. Pat. No. 4,035,906, and divisional applications Ser. No. 691,655 filed June 1, 1976 (abandoned in favor of pending continuation application Ser. No. 853,380 filed Nov. 4, 1977); Ser. No. 691,656 filed June 1, 1976, now U.S. Pat. No. 4,027,381 issued June 7, 1977; and Ser. No. 691,657 filed June 1, 1976, now U.S. Pat. No. 4,027,382 issued June 7, 1977, which description is incorporated herein by reference.

It will be noted that beneath the forward half of each phase electrode 12, in the direction of charge propagation along the channel, there is an implanted potential well region 16.

The output region OPA also defines the source of an output insulated gate field effect transistor (IGFET) $Q_{OG}$ forming part of a charge regeneration amplifier RA1 which couples the output region OPA and the input region IPB. The transistor $Q_{OG}$ comprises a buried channel structure and has an implanted potential well under its gate region and an n+ drain region connected to a supply potential $V_{DD}$, (e.g. 10 volts) the gate being connected to a potential $V_{OG}$ which, in the present example, suitably is approximately ground potential.

The regenerator amplifier RA1 also includes a thresholding IGFET Q1 whose gate is connected to the output region OPA and which has a channel connected at one end to the input region IPB and at the other end to a depletion mode IGFET Q2, the drain of which is connected to a voltage $V_{REF}$. A precharge IGFET Q3, gated by $\overline{MC}$ pulses provided by the clock pulse source CPS, has its channel connected between the drain potential $V_{DD}$ and the input region IPB. The transistor Q3 is a buried channel device with a potential well implanted beneath its gate.

The circuit elements $Q_{OG}$, and Q1 to Q3 together define the charge regenerator amplifier RA1. A further charge regenerator amplifier RA2 connects the output region OPB and the input region IPA, the amplifier RA2 being constructed identically to the amplifier RA1 as thus far described.

As mentioned previously, the CCD shift registers are buried channel devices and include potential wells implanted beneath the clock electrodes. In order to provide for proper operation of the IGFET devices of the regenerator amplifiers and the data input and data output circuits, certain ones of these transistors are buried channel devices (identified by the legend BC in the drawings) and certain ones have threshold voltages adjusted by a potential well, (identified in the drawings by + + +) corresponding to that beneath a CCD electrode 12, implanted in the gate region. In part, these transistor structures are required to ensure functional compatibility with potentials generated in operation of the CCDs at their input and output regions, and in part to provide for proper operation by external gating pulses having predetermined levels. However, the channel modifications of the various transistor structures are not an essential feature of the invention and surface channel structures could be employed in conjunction with surface channel CCDs for example.

The regenerator RA1 also includes data input and data output circuits. The data input circuit includes IGFETs Q4, Q5, and Q6 serially connected between $V_{DD}$ and the transistor Q2 and gated, respectively, by $\overline{DATA}$, WE and ADD pulses. The input circuit additionally includes IGFETS Q7 and Q8 serially connected across the IGFET Q1 and gated, respectively, by ADD and WE pulses. The data output circuit includes a source follower IGFET amplifier Q9, Q10 the gate of Q9 being connected to the input region IPB and Q10 having its source connected to an output terminal OP and being gated by ADD pulses.

Figure 2A:
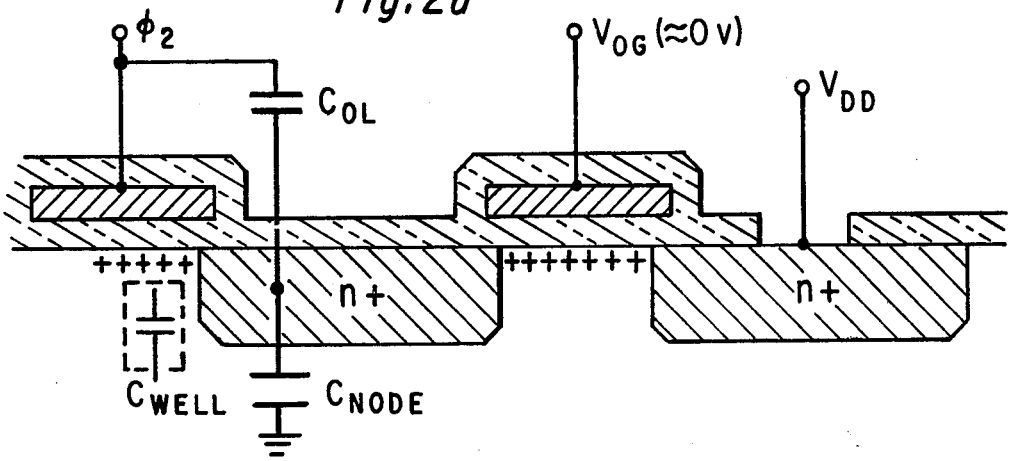
FIG. 2a is a sectional detail of the output region of a CCD and FIG. 2b is a surface potential diagram illustrating operation thereof.

The basic manner of operation of the regenerator amplifiers will be described with reference to regenerator RA1, in conjunction with shift registers CCD1 and CCD3, for the time being ignoring operation of the data input and data output circuits. Several internal capacitances of the structure comprising the final $\phi 2$ clock electrode stage of the shift register CCD1 and the output region OPA are pertinent to operation of the charge regenerator amplifier RA1. These capacitances are represented in FIG. 2a. The capacitance $C_{OL}$ is the overlap capacitance between the final clock electrode $\phi 2$ and the output region OPA. The capacitance $C_{WELL}$ is that of the potential well beneath the final clock electrode $\phi 2$. The capacitance $C_{NODE}$ has several components including the non-linear junction capacitance between the output region OPA and the substrate 10, the overlap capacitance between the gate of the transistor $Q_{OG}$ and the output region OPA, which is a constant capacitance, and the capacitance of the gate of the thresholding transistor Q1. The latter capacitance is generally the dominant component of $C_{NODE}$ but this depends strongly on the operating condition of transistor Q1, being fairly low when Q1 is cut off and increasing quite sharply when Q1 begins to turn on.

Figure 2B:
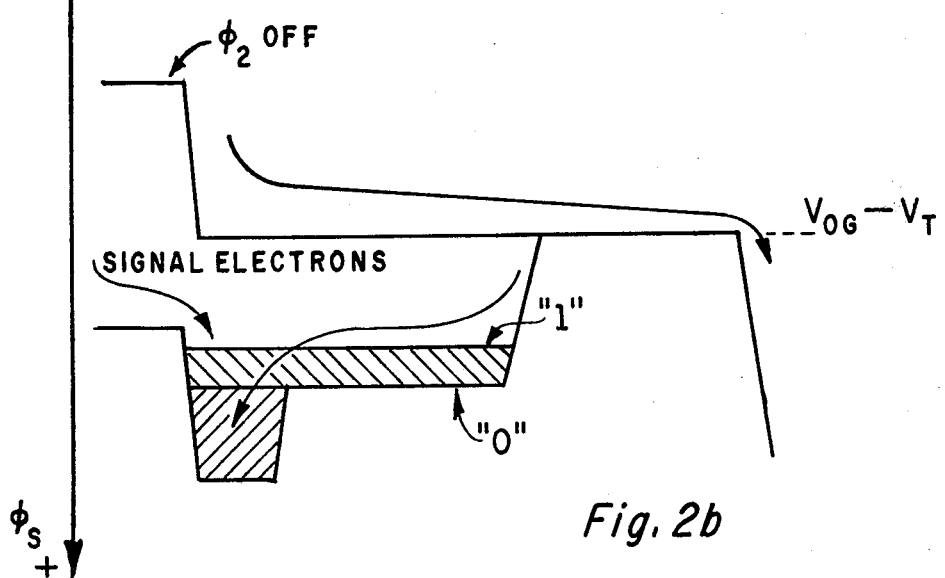

As mentioned above, the buried channel output gate $Q_{OG}$ has an implanted potential well in its gate region and the gate is held near ground potential. Thus, when the final clock electrode $\phi 2$ of the shift register CCD1 is turned off, electrons from beneath that clock electrode are gated by the transistor $Q_{OG}$ and drained off by the drain supply $V_{DD}$ such that the potential of the output region OPA is held at $V_{OG}-V_T$, where $V_T$ is the threshold voltage of the transistor $Q_{OG}$. This situation is illustrated by FIG. 2b which shows the surface potential distribution in the region of the output region OPA and the transistor $Q_{OG}$ when $\phi 2$ is off. When the clock pulse $\phi 2$ turns on, several events occur. The turn-on transient of the clock pulse $\phi 2$ capacitively divides between the capacitances $C_{OL}$ and $C_{NODE}$. At the same time, electrons from the output region OPA spill back into the final well of CCD1 resulting in a rise in the output voltage. When the clock pulse $\phi 2$ was off, the output region OPA was at a potential $V_{OG1}-V_T$ and the charge was distributed between $C_{NODE}$ and $C_{OL}$. When the clock pulse $\phi 2$ turns on, this fixed charge redistributes itself among $C_{NODE}$, $C_{OL}$ and $C_{WELL}$.

A further contribution to the output signal is provided by the signal charge itself. When the clock pulse $\phi 2$ turns on, charge held beneath the preceding phase electrode 12 clocked by $\phi 1$ dumps over the potential barrier beneath the final $\phi 2$ electrode into the output region OPA. This charge is then shared among the capacitances $C_{WELL}$, $C_{NODE}$ and $C_{OL}$. A logical 1 (in this specification defined as a full potential well of signal electrons) will cause the output voltage to fall whereas a logical 0 will cause no significant change in the output voltage.

Figure 4:
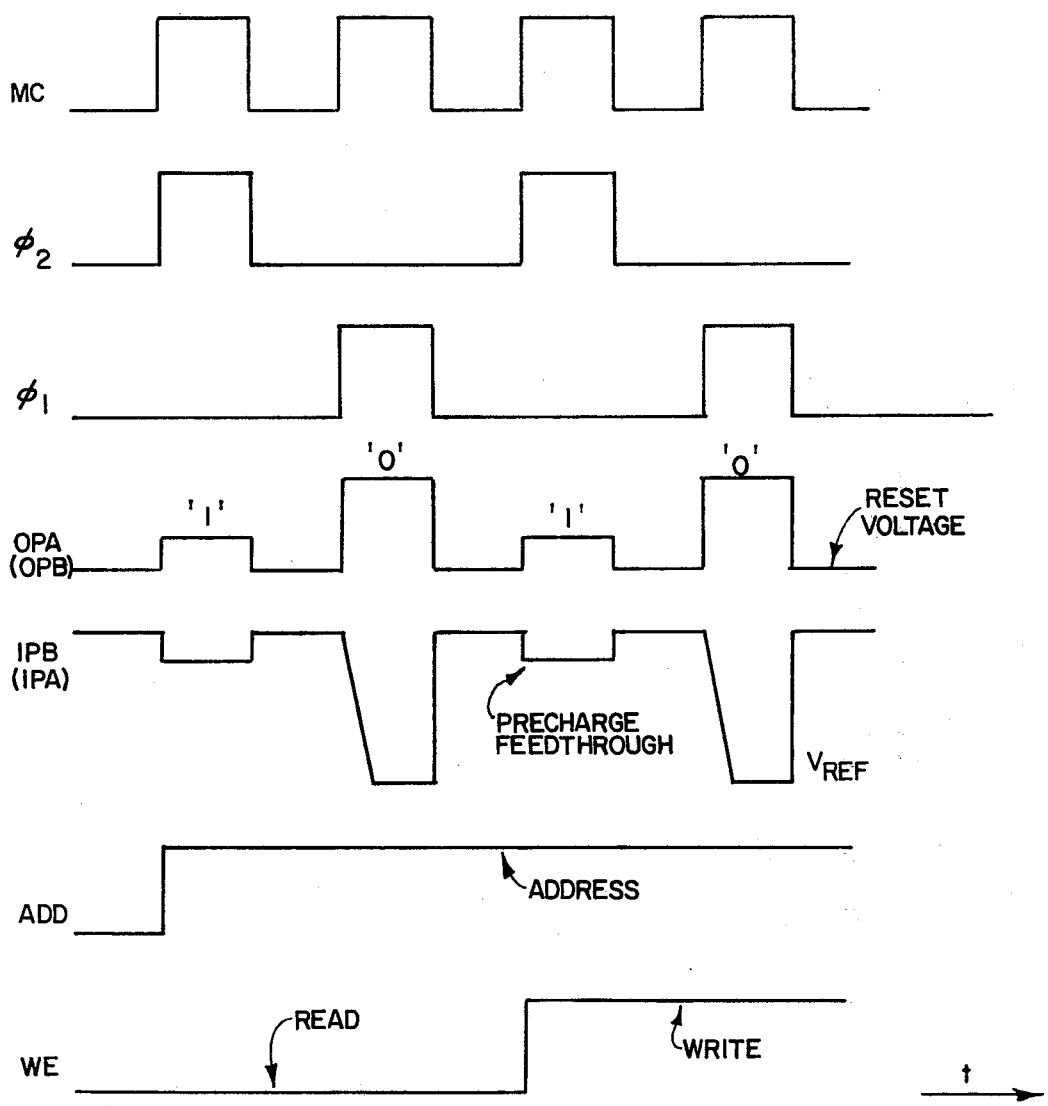
FIG. 4 shows waveforms illustrating operation of the structure shown in FIG. 1.

In a memory structure described herein, the CCDs are phase multiplexed with the two shift registers CCD1 and CCD2 sharing the common output region OPA. Thus, while shift registers CCD3 and CCD4 share the common output region OPB shift register CCD1 delivers an output during $\phi 2$ pulses and the shift register CCD2 during $\phi 1$ pulses. Similarly, shift registers CCD3 and CCD4 deliver outputs to the output region OPB during $\phi 2$ and $\phi 1$, respectively. Thus, output data is obtained at the frequency of the master clock pulses MC, a typical output waveform being shown in FIG. 4 in relation to the master clock.

Figure 3A:
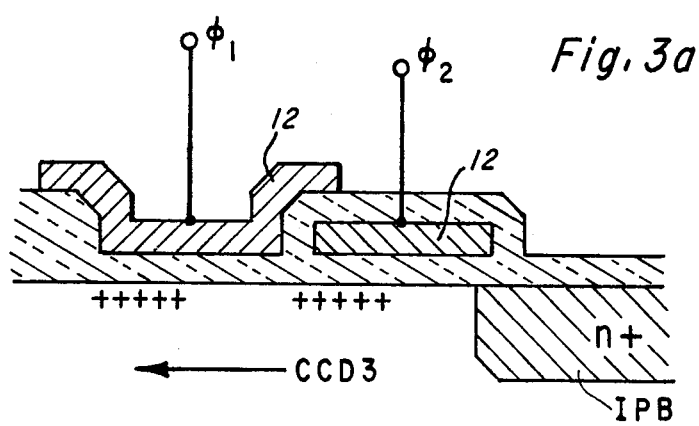
FIG. 3a is a sectional detail of the input region of a CCD and FIG. 3b is a surface potential diagram illustrating operation thereof.
Figure 3B:
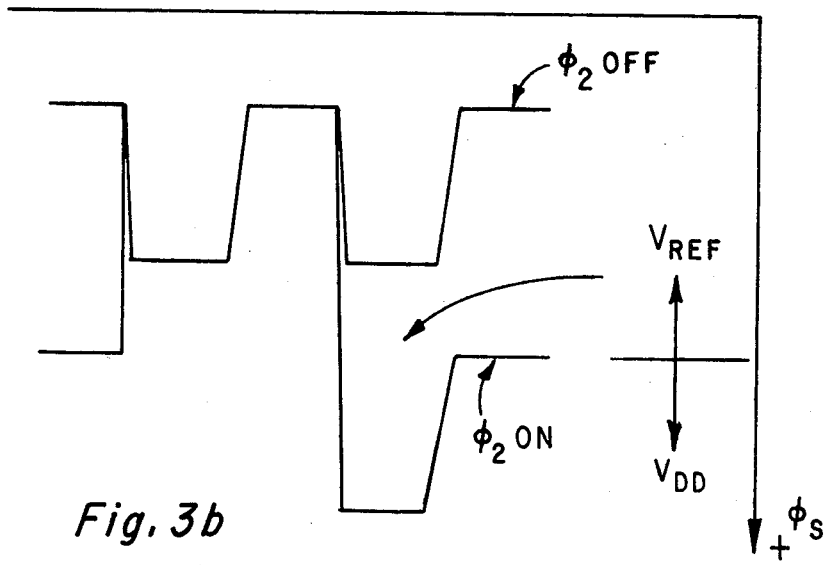

Returning now to the manner of operation of the charge regenerator amplifier RA1, it has previously been noted that the IGFET Q2 is a depletion mode transistor and, in the configuration shown operates like a resistor for low values of $V_{DS}$. When the master clock MC is off, transistor Q3 charges the CCD input node IPB to $V_{DD}$. When the master clock MC turns on, the precharge transistor Q3 cuts off and the signal level of the output node OPA is established on the gate of the thresholding transistor Q1. The value of $V_{REF}$ is selected such that a logical 1 signal at the output node OPA will maintain the transistor Q1 cut off whereas a logical 0 will turn it on. Optimum thresholding is obtained by setting $V_{REF} = \frac{1}{2}(V(1)+V(0)) - V_T$. If transistor Q1 does not turn on, then the input node IPB will remain near $V_{DD}$. However, in response to a logical 0 signal at the output node OPA, transistor Q1 is turned on and the input node IPB discharges to $V_{REF}$. Thus, a logical 1 charge packet at the output node OPA regenerates a logical 0 charge packet at the input IPB and vice versa. The charge transfer process at the input region IPB of the shift register CCD3 is illustrated in FIGS. 3a and 3b. When $\phi 2$ turns on, the output signal is established at region OPA and the input node IPB is set at $V_{DD}$ or $V_{REF}$ and then $\phi 2$ turns off. $V_{DD}$ must be greater than the barrier potential under the first $\phi 2$ clock electrode of the shift register CCD3 in order to ensure that no charge (i.e. a logical 0) is entered into the shift register as $\phi 2$ turns off. Likewise $V_{REF}$ must be lower than that potential barrier so that when transistor Q1 is turned on, charge (i.e. a logical 1) can be entered into the potential well beneath the first $\phi 2$ clock electrode of the shift register CCD3. As the clock pulse $\phi 2$ turns off, the potential barrier falls below $V_{REF}$, cutting off the potential well beneath the first $\phi 2$ electrode of CCD3, which is full of charge. For some values of $C_{OL}$ and $C_{NODE}$ it may be necessary to provide an implanted doped region beneath the gate of transistor Q1 to ensure that this condition can be met.

The speed of the regenerator circuit is primarily determined by the thresholding transistor Q1 which, when turned on, has a constant $V_{GS}$ value and functions as a current source pumping the node capacitance of the input region IPB. The transistor Q2 is so designed that its saturation current is much greater than that of transistor Q1 and thus imposes no appreciable speed limitation on operation of the regenerator. In a preferred design, the transistor Q1 is made as small as possible and the lower extreme value of $V_{REF}$ is used.

The regenerator RA2 functions in conjunction with the output region OPB, the input region IPA and the shift registers CCD2 and CCD4 in a manner identical to that just described with reference to the regenerator RA1 in conjunction with shift registers CCD1 and CCD3, except that charge is gated from the shift register CCD2 and into the shift register CCD4 by $\phi 1$ clock pulses instead of $\phi 2$ clock pulses. Thus, it will be appreciated that in operation of the memory structure illustrated by FIG. 1, multiplexed data flow is obtained through the shift registers in a recirculating manner at a data rate corresponding to that of the master clock pulses MC.

Output data is obtained from the memory structure by the source follower Q9, Q10 gated by ADD pulses applied to the gate of transistor Q10. The input to the source follower is obtained from the input regions IPB with a data level swing between $V_{REF}$ and $V_{DD}$. Since these data levels are reasonably high, e.g. $V_{REF} = 10$ volts and $V_{DD} = 18$, the gate region of the output transistor Q9 does not include an implanted potential well and is a surface channel device. However, the gating transistor Q10 is required to operate with lower, typically 10 volt logic levels, and is a buried channel device with an implanted potential well beneath its gate region in order to ensure that it will turn on sufficiently to provide proper output signal levels, e.g. 8 volts–10 volts.

The data input circuit is enabled by application of write enable (WE) pulses to transistors Q5 and Q8 simultaneously with application of address (ADD) pulses to transistors Q6 and Q7. The gate regions of transistors Q7 and Q8 have implanted potential wells so that they have the same gate threshold level as the barrier potential of the CCD channels to ensure that when transistors Q7 and Q8 are on, the potentials beneath their gates are greater than $V_{REF}$ and when those transistors are off the potentials beneath their gates are less than $V_{REF}$.

With simultaneous application of pulses WE and ADD, the transistors Q7 and Q8 disable the thresholding transistor Q1 by effectively short circuiting it. At the same time the transistors Q5 and Q6 enable the source follower circuit, of which transistor Q2 is the load transistor and transistor Q4 is the drive transistor. The gate of transistor Q4 is pulsed with the inverse of the data level ($\overline{DATA}$) required to be inputted and is held normally high. If the data pulse is low at any time during the on period of the master clock pulses MC, a logic 1 will be entered into the shift register CCD3 during a $\phi 2$ clock pulse or into the shift register CCD4 during a $\phi 1$ pulse.

The transistors Q4, Q5, and Q6 are buried channel devices and have potential wells implanted beneath their gate electrode to ensure that they will turn on sufficiently with 10 volt gate levels. Because the data have full 10 volt levels, the write or inputting operation is much faster than the charge regeneration operation and does not limit the maximum speed of the regenerator RA1.

FIG. 5 illustrates the charge regenerator RA1, modified to include a different data input circuit. The gate of IGFET Q2 is connected to the drain supply potential $V_{DD}$ by an IGFET Q11. The transistors Q4, Q5, and Q6 are connected between the gate and source of the IGFET Q2 and IGFET Q6 is gated by DATA instead of $\overline{DATA}$ pulses. The transistor Q2 is precharged to an on condition by transistor Q11 during an $\overline{MC}$ pulse. To input data into the input region IPB transistors Q4, Q5, and Q6 are simultaneously gated by WE, ADD and DATA pulses thereby discharging transistor Q2 and cutting it off. In order to ensure that transistor Q2 cuts off fast enough to prevent the discharge of the input region IPB to $V_{REF}$ before the transistor Q2 cuts off, the source of transistor Q2 is connected to $V_{REF}$ by a transistor Q12 (which if desired may have an implanted potential well beneath its gate) gated by the master clock pulses MC. Alternatively, the master clock inverse $\overline{MC}$ may be delayed so that the DATA input, which is synchronized with the master clock pulses MC, is established by the time MC turns off. The circuit shown in FIG. 5 is advantageous in that it dissipates little power.

FIG. 6 illustrates an alternative data output circuit which can be used in place of that shown in FIG. 2 and FIG. 5. The location of the IGFETs Q9 and Q10 is changed so that the gate of transistor Q9 is connected to the drain of the output gate transistor $Q_{OG}$ and a precharge transistor Q13, gated by MC pulses, is connected between the drain supply potential $V_{DD}$ and the gate of transistor Q9. An advantage of this data output gating circuit is that old data can be read out of the shift register memory while new data is being entered. However, this advantage is attained at the expense of an extra bus line for the master clock and an output data level which is lower than desirable and synchronized with the inversed master clock, since it is delayed by one-half bit from the output region OPA.

Figure 7:
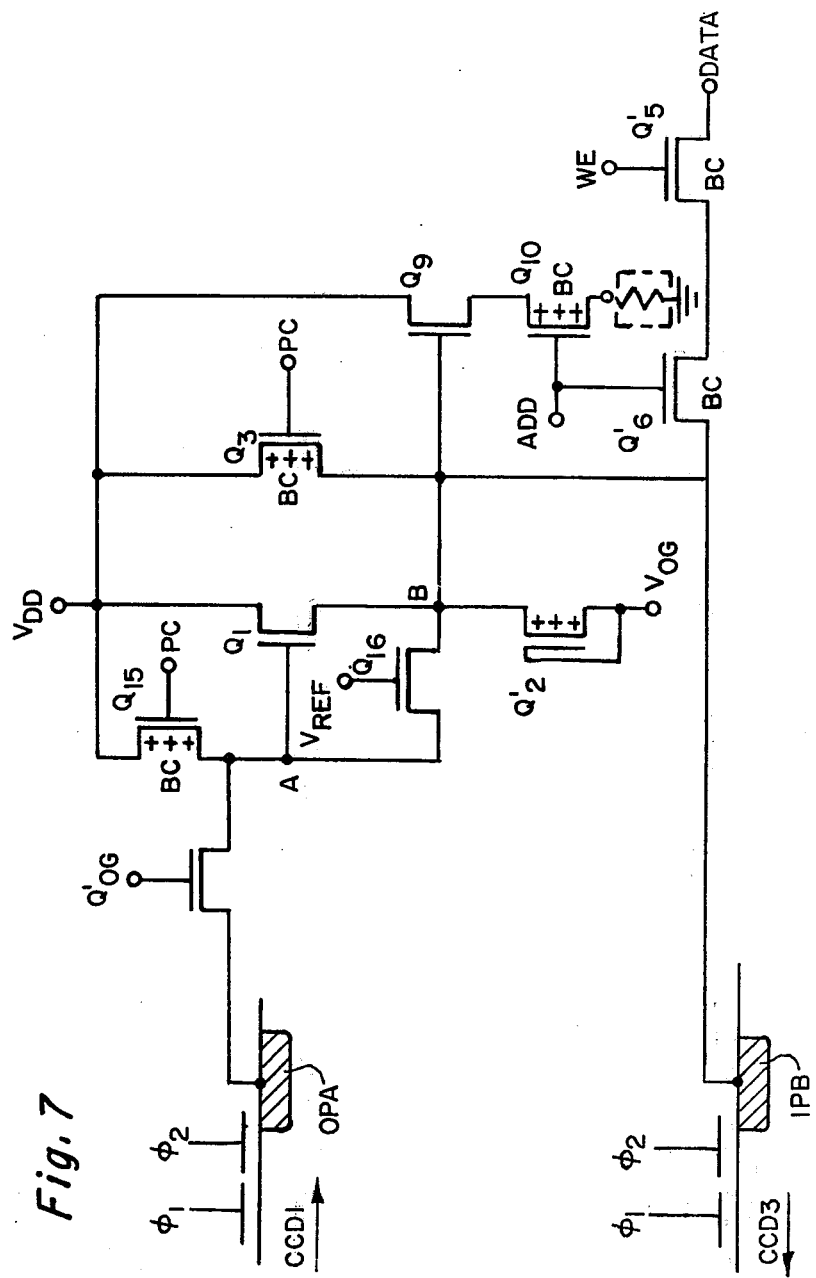
FIG. 7 illustrates an alternative charge regenerator.

FIG. 7 illustrates an alternative form of regenerator to that described with reference to FIG. 1 and which is advantageous in that charge regeneration is accomplished without inversion of the data levels. In FIG. 7, the output gate $Q'_{OG}$ defines a precharge node A and is connected to the gate of the IGFET Q1, the gate and source of which are interconnected by a thresholding IGFET Q16 having a gate which is held at a constant potential $V_{REF}$, suitably 14 volts. Transistor Q1 functions as the driver stage of a source follower amplifier the load transistor of which, Q2′ has an implanted well beneath its gate region. The source of transistor Q1 defines a follower node B. A precharge IGFET Q15 connects the precharge node A to the drain potential $V_{DD}$ and is a buried channel transistor with an implanted potential well. The precharge transistors Q3 and Q15 are gated by precharge pulses PC during the period of the master clock pulses MC.

The voltage set on the gate of the output transistor $Q'_{OG}$, which also is the source voltage of transistor Q2′, is selected to be less than the potential under a CCD phase electrode 12 when in the on condition. This potential will become that for injecting a logic one data charge into the input region IPB. While the master clock MC is on, the precharge transistor Q15 charges the precharge node A to $V_{DD}$. When the master clock pulse MC turns off, signal charge dumps over the output transistor $Q'_{OG}$ onto the precharge node A. A logic one data charge will cause the voltage on the precharge node A to drop, this voltage being tracked by the source follower Q1, Q2′. The voltage at the source follower node B is lower than that at the precharge node A and if it falls below ($V_{REF}$—$V_T$) (where $V_T$ is the threshold voltage of transistor Q16), then transistor Q16 turns on establishing a positive feedback path between the gate and source of transistor Q1 so that the potential at the follower node B will fall until it reaches $V_{OPG}$ and transistor Q2′ turns off. Since the follower node B is connected to the input region IPB, a logic one data charge is thereby clocked into the shift register CCD3 during the next $\phi2$ pulse. The subsequent occurrence of the precharge pulse PC then commences a fresh regeneration cycle. If a logic zero data charge is present at the output region OPA, the follower node B never falls below $V_{REF}$—$V_T$, the thresholding transistor Q16 remains cut off and the input region IPB remains at the precharge level $V_{DD}$. The transistor Q3 is an auxiliary precharge transistor to set the input region IPB at $V_{DD}$ during a precharge pulse PC and is included primarily to increase the operating speed of the regenerator circuit.

The charge regenerator connected between the output region OPB and the input region IPA would be identical to that just described. However, the charge regenerator connected between the output region OPA and the input region IPB also includes a data input and data output circuit. The data output circuit includes a source follower amplifier Q9, Q10 with the gate of transistor Q9 connected to the input region IPB to sense the charge level thereat and the transistor Q10 being gated by an ADD pulse as described with reference to FIG. 1. The data input circuit comprises transistors Q5′ and Q6′, which are buried channel devices but without an implanted potential well, the intended DATA input being applied to the source of transistor Q5′ which is gated by a WE pulse while transistor Q6′ is gated by an ADD pulse. Simultaneous gating of transistors Q5′ and Q6′ thus enters data present on the source of transistor Q5′ to the input region IPB for transfer into the shift register CCD3 during a $\phi2$ clock pulse or into shift register CCD4 during a $\phi1$ pulse. The source of DATA pulses must be a low impedance source switching between $V_{DD}$ (logic zero data input) and $V_{OG}$ (logic one data input).

Because of the precharge-discharge mode of operation of the charge regenerator circuits described herein, they are capable of driving a capacitance at the input node of the CCD shift register. This feature is particularly attractive in CCD memory structures employing multiplexed electrode per bit organizations where it is generally desirable to run a return line from the output end of the CCD back to the input. The charge regenerator circuit described with reference to FIG. 7 is particularly well adapted to use in such a memory application. The regenerator circuits described are all suitable for CCD organizations which multiplex several CCD channels into a common output diode, allowing exploitation of the high density and high bit rate features of CCDs. Although description of the regenerators has been made with reference to a particular, buried channel two-phase CCD structure, the regenerators are suitable for use with two-phase CCD structures in general, both buried channel and surface channel types.

What is claimed is:

1. In a charge coupled device memory including a pair of charge coupled device shift register structures each having a data input region and a data output region, and phased clock pulse means coupled to said shift register structures for shifting binary data charge packets in said shift register structures;

first and second insulated gate field effect transistor charge regenerator amplifier means respectively cross coupling said output regions with said input regions, each of said regenerator amplifier means being operable to sense the level of binary data charge packets from the output region of one of said shift register structures and in response thereto to apply a regenerated and inverted binary data charge packet to the input region of the other of said shift register structures; one of said regenerator amplifier means further including data input insulated gate field effect transistor means operable in response to data and address inputs for providing a conductive path bypassing said regenerator amplifier means to connect the input region associated with said regenerator amplifier means alternatively to one of two reference potentials for entering a predetermined binary data charge level into said input region according to said data input; and data output insulated gate field effect transistor means operably responsive to an address input to nondestructively sense the binary data charge level present at one of said input and output regions associated with said regenerator amplifier means to generate a corresponding binary data output signal.

2. A memory according to claim 1, wherein said data output insulated gate field effect transistor means comprises a source follower transistor output amplifier having a gate input connected to said input region for alternatively turning said output amplifier to an on or an off condition during an address input thereto according to the binary data charge level in said input region.

3. A memory according to claim 1, wherein each of said regenerator amplifier means comprises first insulated gate field effect transistor means having a channel connected to the output region associated with that regenerator amplifier means and means applying a gate voltage to said first transistor means to charge said output region during one phase of said phased clock pulse means to a value determined by said gate voltage;

second insulated gate field effect transistor means having a channel for coupling a first reference potential to the input region associated with said regenerator amplifier means during said one phase of said phased clock pulse means to charge said input region to a predetermined level corresponding to a predetermined one of said binary data charge levels; and third insulated gate field effect transistor means having a channel connected to the input region associated with said regenerator amplifier means and a second reference potential and having a gate coupled to said output region for nondestructively sensing the level of a charge packet shifted into said output region during a phase of said phased clock pulse means following said one phase and responsive to said sensed charge packet level to gate said second transistor means alternatively to a conductive or a non-conductive state, when gated to a conductive state said third transistor means providing a conductive path between said input region and said second reference potential to permit a change in the charge level of said input region from said predetermined level to a level corresponding to said other binary data charge level.

4. A memory according to claim 3, including a further transistor means connecting the channel of said third transistor means to said second reference potential.

5. A memory according to claim 3, including depletion mode load transistor means connecting the channel of said third transistor means to said second reference potential.

6. A memory according to claim 3, including a fourth transistor means connecting the channel of said third transistor means to said second reference potential, and further including first cascade transistor means comprising three cascaded transistors connected between the gate and source of said fourth transistor means.

7. A memory according to claim 3, including a depletion mode load transistor connecting the channel of the third transistor means to said second reference potential, and further including first cascade transistor means comprising three cascaded transistors connected between the source of said depletion mode load transistor and said first reference potential.

8. A memory according to claim 3, wherein said data output insulated gate field effect transistor means comprises a source follower transistor output amplifier having a gate input connected by said first insulated gate field effect transistor means to said output region for alternatively turning said output amplifier to a conductive or non-conductive condition during an address input thereto according to the binary data charge level in said output region, independently of inputting charge into said input region.

9. A charge coupled device memory including a first charge coupled device shift register structure having an output region and a second charge coupled device shift register structure having an input region, phased clock pulse means coupled to said shift register structures for shifting charge in said shift register structures; and charge regenerator means coupled between said output region and said input region, said charge regenerator means comprising a source follower insulated gate field effect transistor amplifier means including a driver transistor, a load transistor and a positive feedback transistor connected between the gate and source of said driver transistor, an output transistor gate connected between said output region and the gate of said driver transistor for sensing a binary data charge level at said output region and to bias said driver transistor to a conductive state in response to a sensed charge level corresponding to one binary level and to a non-conductive state in response to a sensed charge level corresponding to the other binary level; means connecting the output of said source follower amplifier means to said input region to insert a first predetermined charge corresponding to said one binary data level in response to said output transistor gate sensing a charge level corresponding to said one binary data level and a second predetermined charge corresponding to the other binary data level in response to said output transistor gate sensing a charge level corresponding to that other binary data level; and further transistor gating means for precharging the gate of said driver transistor to a predetermined level prior to sensing of said output region charge level by said output transistor gate.

10. A memory according to claim 9, wherein said charge coupled device shift register structures comprise coplanar electrode two-phase structures.

11. A memory according to claim 9, including semiconductor gating means for selectively and nondestructively sensing charge level at the output of said source follower amplifier means to generate a corresponding binary level output singal, and for selectively entering a predetermined charge corresponding to either binary data level into said input region.

12. A memory according to claim 9, wherein said charge coupled device shift register structures and said transistors are all disposed in a common silicon substrate.

13. A charge coupled device memory including at least first and second charge coupled device shift register structures each having an output region and an input region, phased clock pulse means coupled to said shift register structures for shifting charge in said shift register structures; first and second charge regenerator means cross coupling said output regions with said input regions, each of said charge regenerator means comprising:

a source follower insulated gate field effect transistor amplifier means including a driver transistor, a load transistor and a positive feedback transistor connected between the gate and source of said driver transistor, an output transistor gate connected between the output region of one of said shift register structures and the gate of said driver transistor for sensing a binary data charge level at said output region and to bias said driver transistor to a conductive state in response to a sensed charge level corresponding to one binary level and to a non-conductive state in response to a sensed charge level corresponding to the other binary level; means connecting the output of said source follower amplifier means to the input region of the other said shift register structure to insert a first predetermined charge corresponding to said one binary data level in response to said output transistor gate sensing a charge level corresponding to said one binary data level and to insert a second predetermined charge corresponding to the other binary data level in response to said output transistor gate sensing a charge level corresponding to that other binary data level; and further transistor gating means for precharging the gate of said driver transistor to a predetermined level prior to sensing of said output region charge level by said output transistor gate;

and further including semiconductor gating means for selectively and non-destructively sensing charge level at the output of one of said source follower amplifier means to generate a corresponding binary level output signal, and for selectively entering a predetermined charge corresponding to one or the other of said binary data levels into the input region to which that said source follower amplifier means is connected.

14. A charge regenerator circuit for a charge coupled device structure including a charge coupled device data output region and a charge coupled device data input region, comprising amplifier means for sensing a charge level at said output region representing a digital 1 data level or a digital 0 data level and controllable by said sensed charge level for inserting into said input region a predetermined amount of charge respectively corresponding to said digital 1 data level or to said digital 0 data level without inversion, said amplifier means including a source follower insulated gate field effect transistor amplifier comprising a driver transistor, a depletion mode load transistor, and positive feedback means including an insulated gate field effect transistor having a channel connected between the gate and source of said driver transistor.

15. A charge regenerator circuit for a charge coupled device structure including a charge coupled device data output region and a charge coupled device data input region, comprising amplifier means for sensing a charge level at said output region representing a digital 1 data level or a digital 0 data level and controllable by said sensed charge level for inserting into said input region a predetermined amount of charge respectively corresponding to said digital 1 data level or to said digital 0 data level without inversion, and means for precharging the input and output of said amplifier means to a predetermined potential prior to sensing said charge level at said output region.

* * * * *